US011652479B2

(12) United States Patent
Maiocchi et al.

(10) Patent No.: US 11,652,479 B2
(45) Date of Patent: May 16, 2023

(54) METHOD OF CONTROLLING A HALF-BRIDGE CIRCUIT

(71) Applicant: STMicroelectronics S.r.l., Agrate Brianza (IT)

(72) Inventors: Giuseppe Maiocchi, Villa Guardia (IT); Ezio Galbiati, Cremona (IT); Michele Boscolo Berto, Milan (IT); Maurizio Ricci, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/659,226

(22) Filed: Apr. 14, 2022

(65) Prior Publication Data

US 2022/0239294 A1    Jul. 28, 2022

Related U.S. Application Data

(63) Continuation of application No. 17/150,156, filed on Jan. 15, 2021, now Pat. No. 11,336,280.

(30) Foreign Application Priority Data

Jan. 17, 2020    (IT) .................. 102020000000859

(51) Int. Cl.
*H03K 17/687*    (2006.01)
*H02M 3/157*    (2006.01)
*H02M 1/00*    (2006.01)

(52) U.S. Cl.
CPC ...... *H03K 17/6877* (2013.01); *H02M 1/0025* (2021.05); *H02M 3/157* (2013.01); *H03K 17/6874* (2013.01)

(58) Field of Classification Search
CPC .......... H03K 17/6877; H03K 17/6874; H03K 17/687; H02M 1/0025; H02M 1/0022; H02M 3/157; H02M 1/0003; H02M 3/156; H02M 3/158; H02M 3/155
See application file for complete search history.

(56) References Cited

U.S. PATENT DOCUMENTS

| | | | |
|---|---|---|---|
| 5,932,938 A | 8/1999 | Shimamori | |
| 6,414,614 B1 | 7/2002 | Melanson | |
| 8,018,364 B2 | 9/2011 | Maiocchi | |
| 9,450,492 B1 | 9/2016 | Bizjak et al. | |
| 9,780,703 B2 | 10/2017 | Maiocchi | |
| 2011/0316508 A1 | 12/2011 | Cheng et al. | |
| 2018/0337599 A1 | 11/2018 | Chen et al. | |
| 2019/0386561 A1* | 12/2019 | King | H02M 3/1582 |

* cited by examiner

*Primary Examiner* — Jung Kim
(74) *Attorney, Agent, or Firm* — Slater Matsil, LLP

(57) ABSTRACT

A method of controlling a half-bridge circuit includes receiving an analog feedback signal proportional to an output of the half-bridge circuit, comparing the received analog feedback signal with a threshold value, selecting a digital feedback signal based on a result of the comparing, comparing the digital feedback signal with a digital reference signal to generate a digital error signal, integrating the digital error signal to generate an integration error signal, downscaling the integral error signal to generate a downscaled integration signal, sampling the downscaled integration signal to generate a sampled integration signal, and generating pulsed signals from the sampled integration signal to provide an input to the half-bridge circuit.

20 Claims, 8 Drawing Sheets

METHOD OF CONTROLLING A HALF-BRIDGE CIRCUIT

CROSS-REFERENCE TO RELATED APPLICATIONS

This application is a continuation of U.S. patent application Ser. No. 17/150,156, filed Jan. 15, 2021, now U.S. Pat. No. 11,336,280, issued May 17, 2022, which application claims the benefit of Italian Application No. 102020000000859, filed on Jan. 17, 2020, all of which applications are hereby incorporated herein by reference.

TECHNICAL FIELD

The embodiments of the present description relate to controlling half-bridge circuits.

BACKGROUND

FIG. 1 shows a typical drive arrangement, wherein a load 20 is supplied via a half-bridge arrangement 10.

Specifically, in the example considered, the half-bridge arrangement 10 comprises:
- a (positive) supply terminal 100 configured to be connected to a supply voltage Vdd;
- a (negative) supply terminal 102 configured to be connected to a reference voltage, such as a ground GND;
- an input terminal 104 for receiving a binary input signal IN indicating the switching state of the half-bridge arrangement 10;
- an output terminal 106 configured to be connected to a load 20, thereby providing an output voltage Vout to the load 20;
- a first/high-side electronic switch T1 (having a current-path) connected (e.g. directly) between the terminal 100 and the terminal 106;
- a second/low-side electronic switch T2 (having a current-path) connected (e.g. directly) between the terminal 106 and the terminal 102; and
- a half-bridge driver circuit 12 configured to generate drive signals HS' and LS' for the control terminals of the electronic switches T1 and T2, respectively, e.g. for the gate terminals of respective FETs.

For example, the electronic switches T1 and T2 may be transistors, such as a Field-Effect Transistors (FET), such as a Metal-Oxide-Semiconductor Field-Effect Transistors (MOSFET), preferably n-channel FETs, such as a NMOS.

Specifically, the half-bridge driver circuit 12 is usually configured to:
- when the input signal IN has a first logic level (e.g. high), close the electronic switch T1 and open the electronic switch T2; and
- when the input signal IN has a second logic level (e.g. low), open the electronic switch T1 and close the electronic switch T2.

For example, for this purpose, the half-bridge driver circuit 12 may comprise a control circuit 120 configured to generate binary signal HS and LS indicating the switching state of the high-side switch T1 and the low-side switch respectively. For example, the logic level "high" may indicate that the respective electronic switch (T1 or T2) should be closed and the logic level "low" may indicate that the respective electronic switch (T1 or T2) should be opened.

One of the simplest methods for generating the signals HS and LS as a function of the signal IN consists in:

- setting the value of the signal HS to the value of the signal IN, e.g. by using the signal IN as signal HS; and
- setting the value of the signal LS to the inverted value of the signal IN, e.g. by using the inverted version of the signal IN as signal HS.

The binary signals HS and LS may then be provided to respective high-side and low-side driver circuits 122 and 124 configured to generate the drive signals HS' and LS' for the control terminals of the electronic switches T1 and T2 as a function of the signals HS and LS, respectively.

Thus, in the example considered, the half-bridge driver circuit 10 is configured to either close the switch T1 (and open the switch T2), thereby applying the voltage Vdd to the terminal 106, i.e. Vout=Vdd, or close the switch T2 (and open the switch T1), thereby applying the reference voltage (e.g. GND) to the terminal 106, e.g. Vout=0.

For example, as shown in FIG. 2, often the input signal IN is a Pulse-Width Modulated (PWM) signal, wherein the signal IN is set to high for a switch-on period $T_{ON}$ and low for a switch-on period $T_{OFF}$, wherein the duration of a switching cycle $T_{SW}=T_{ON}+T_{OFF}$ is usually constant. In fact, by using such a PWM signal the average value of the output voltage Vout is a function of the value of the input voltage Vdd and the duty-cycle $D=T_{ON}/T_{SW}$ of the PWM signal IN.

For example, FIG. 3 shows a typical application, wherein a load 20, such as an inductive load, such as an electric motor, is connected between the terminals 106 and 102. In the example considered, the half-bridge arrangement also comprises an analog control circuit 14 configured to generate a PWM signal IN for the half-bridge driver 12. Specifically, in the example considered, the half-bridge arrangement comprises an analog low-pass filter 16, such as a RC filter, configured to generate an analog feedback signal FB indicative of the average value of the output voltage Vout. The control circuit 14 receives at input an analog reference signal REF and the feedback signal FB. Thus, by varying the duty-cycle D of the PWM signal IN, the control circuit 14 may vary the feedback signal FB until the feedback signal FB corresponds to the reference signal REF.

For example, for this purpose the control circuit 14 may comprise:
- an error amplifier configured to generate an error signal indicative of the difference between the feedback signal FB and the reference signal REF; and
- a regulator configured to vary a signal indicative of the duty cycle as a function of the error signal, wherein the regulator circuit comprises (at least) an Integral (I) component.

In this respect, the inventors have observed that a similar solution could also be implemented via a digital processing by using an analog-to-digital converter (ADC) configured to obtain digital samples of the feedback signal FB (indicative of the average value of the output voltage Vout) and by generating via digital processing the PWM signal IN by comparing the digital samples FB with a digital reference value REF. However, such an analog-to-digital converter (ADC) is expensive.

For this reason, U.S. Pat. No. 8,018,364 B1 discloses a different solution, wherein a digital implementation of a sigma-delta converter is used to generate the pulsed signal IN (SDout in document U.S. Pat. No. 8,018,364 B1), essentially by provided a feedback of a digital sample of the amplitude of the input voltage Vdd, based on the logic level of the signal IN.

However, as shown in FIG. 2, often the control circuit 120 is configured to introduce dead-times $T_{D1}$ and $T_{D2}$ between the edges of the signals HS and LS. Specifically, as mentioned before, the signal IN is a binary/pulsed signal, which is thus set to high for a first period, usually the switch-on period $T_{ON}$ (T1 should be closed), and low for a second period, usually the switch-off period $T_{OFF}$ (T2 should be closed). For example, in this case, in response to a rising edge in the signal IN, the signal LS is set immediately to low and the signal HS is set to high after the delay $T_{D1}$. Similarly, in response to a falling edge in the signal IN, the signal HS is set immediately to low and the signal LS is set to high after the delay $T_{D2}$. For example, the dead-times $T_{D1}$ and $T_{D2}$ are often introduced in order to avoid that the electronic switches T1 and T2 are closed contemporaneously.

Moreover, when using n-channel FET, often the driver circuits 122 and 124 implement a slew-rate control as described e.g. in U.S. Pat. No. 9,935,626 B2, the content of which is hereby incorporated herein by reference.

The inventors have observed that the signal IN is thus often not exactly synchronized with the switching of the output terminal 106, whereby the circuit of U.S. Pat. No. 8,018,364 B1 may not generate the requested output voltage Vout. Moreover, the circuit described in document U.S. Pat. No. 8,018,364 B1 is only able to generate a sigma-delta modulated signal and not a pure PWM signal having a constant switching period $T_{SW}$.

SUMMARY

Considering the foregoing, it is therefore an object of various embodiments to provide alternative solutions for driving a half-bridge.

According to one or more embodiments, one or more of the above objects are achieved by a half-bridge control circuit having the distinctive elements set forth specifically in the ensuing claims. Embodiments moreover concern a related integrated circuit and half-bridge circuit.

The claims form an integral part of the technical teaching of the description provided herein.

As mentioned before, various embodiments of the present disclosure relate to a half-bridge control circuit, e.g. implemented in an integrated circuit. In various embodiments, the half-bridge control circuit comprises a positive and a negative supply terminal configured to receive a supply voltage, an input terminal configured to receive a digital reference value having a given first number of bits, an output terminal configured to provide a pulsed signal to a half-bridge driver circuit configured to generate drive signals for two electronic switches connected between the positive and the negative supply terminal, and a feedback terminal configured to receive a feedback signal indicative of the instantaneous value of the voltage at a switching node between the two electronic switches.

In various embodiments, the half-bridge control circuit further comprises a selector circuit, a digital subtractor, a digital integrator, a down-scale circuit, a sampling circuit and a pulse generator circuit.

In various embodiments, the selector circuit is configured to provide a digital feedback signal, wherein the selector circuit is configured to select as digital feedback signal either a non-zero value when the feedback signal is greater than a given threshold value, or a zero value when the feedback signal is smaller than the given threshold value. For example, the selector circuit may comprise an analog comparator configured to generate a comparison signal indicating whether the feedback signal is greater than a given threshold value and a multiplexer. Specifically, the multiplexer may be configured to select as digital feedback signal the non-zero value when the comparison signal indicates that the feedback signal is greater than the given threshold value, or the zero value when the comparison signal indicates that the feedback signal is smaller than the given threshold value.

In various embodiments, the digital feedback signal has the given first number of bits, and the non-zero value is a binary signal having all bits set to high. Alternatively, the digital feedback signal has the given first number of bits plus one, and the non-zero value is a binary signal having the most significant bit set to high and the remaining bits set to low. Alternatively, the half-bridge control circuit may comprise an analog-to-digital converter configured to generate a digital sample proportional to the value of the supply voltage and the non-zero value may correspond to the digital sample.

In various embodiments, the digital subtractor is configured to generate an error signal by subtracting the digital feedback signal from the reference signal. The digital subtractor may be configured to generate an error signal with a two's complement (signed) binary encoding.

In various embodiments, the digital integrator is configured to generate an integration signal by integrating the value of the error signal in response to a clock signal. For example, the digital integrator may comprise a digital accumulator configured to accumulate the value of the error signal in response to the clock signal.

In various embodiments, the down-scale circuit is configured to generate a reduced resolution integration signal by discarding one or more least significant bits of the integration signal. For example, the reduced resolution integration signal may have a given second number of bits, and the down-scale circuit may be configured to set the bits of the reduced resolution integration signal to the second number of most significant bits of the integration signal.

In various embodiments, the sampling circuit is configured to generate a sampled integration signal by sampling the reduced resolution integration signal in response to a sampling signal. For example, the sampling signal may be generated by a clock generator or the pulse generator circuit.

In various embodiments, the pulse generator circuit is configured to generate the pulsed signal as a function of the sampled integration signal, wherein the pulsed signal has switching cycles wherein the pulsed signal is set to high for a given switch-on duration and low for a given switch-off duration, wherein at least one of the switch-on and the switch-off duration is determined as a function of the sampled integration signal. For example, the pulse generator circuit may comprise a pulse-width modulation circuit and/or a sigma-delta pulse-width modulation circuit.

BRIEF DESCRIPTION OF THE DRAWINGS

The embodiments of the present disclosure will now be described with reference to the annexed plates of drawings, which are provided purely to way of non-limiting example and in which.

The features and advantages of the present invention will become apparent from the following detailed description of practical embodiments thereof, shown byway of non-limiting example in the accompanying drawings, in which.

DETAILED DESCRIPTION OF ILLUSTRATIVE EMBODIMENTS

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

Figure 1:
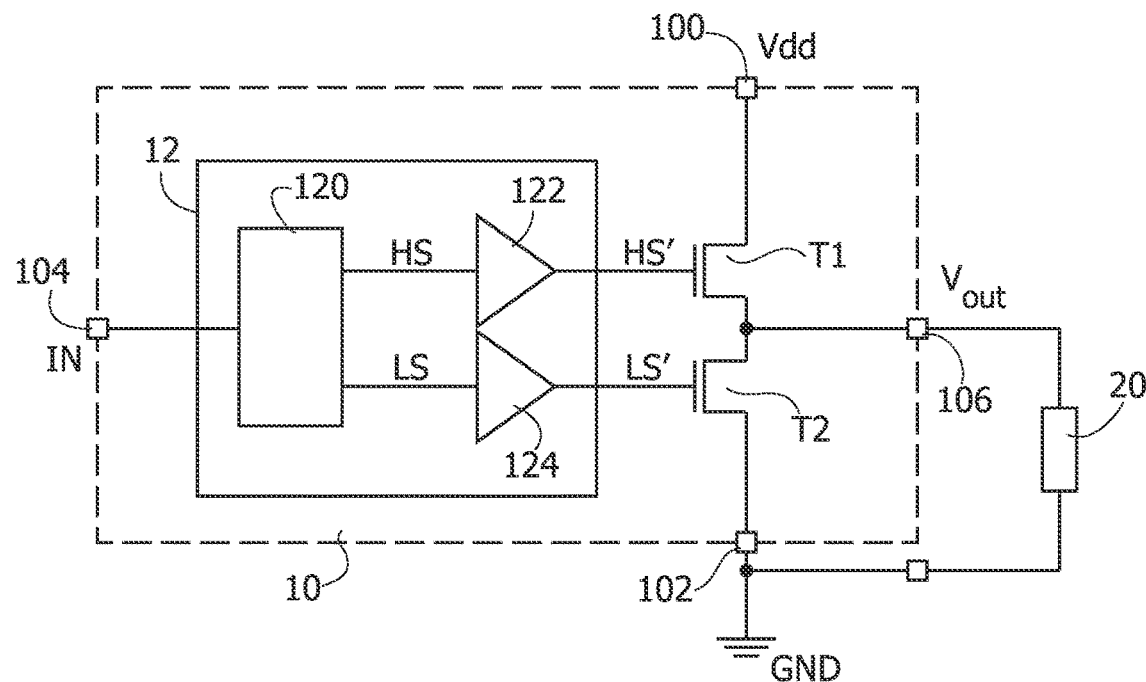
FIG. 1 shows a circuit schematic of a first half-bridge arrangement/circuit comprising a half-bridge driver circuit.
Figure 2:
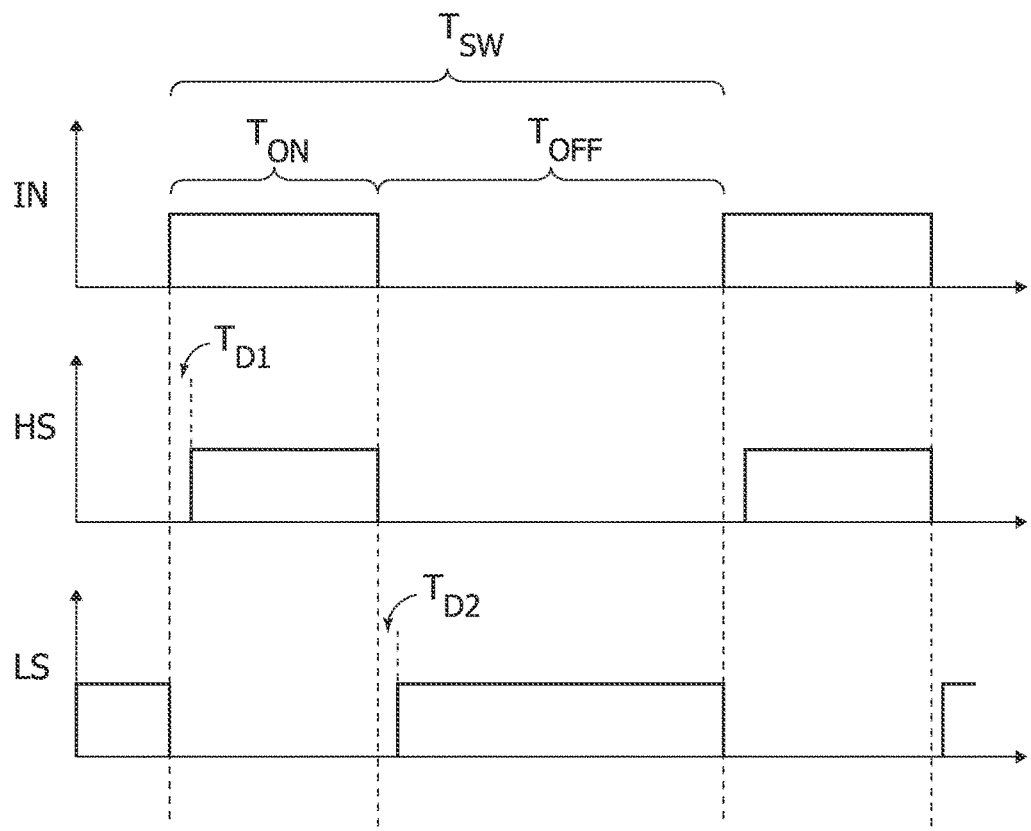
FIG. 2 shows exemplary waveforms of the drive signals generated by the half-bridge driver circuit of FIG. 1.
Figure 3:
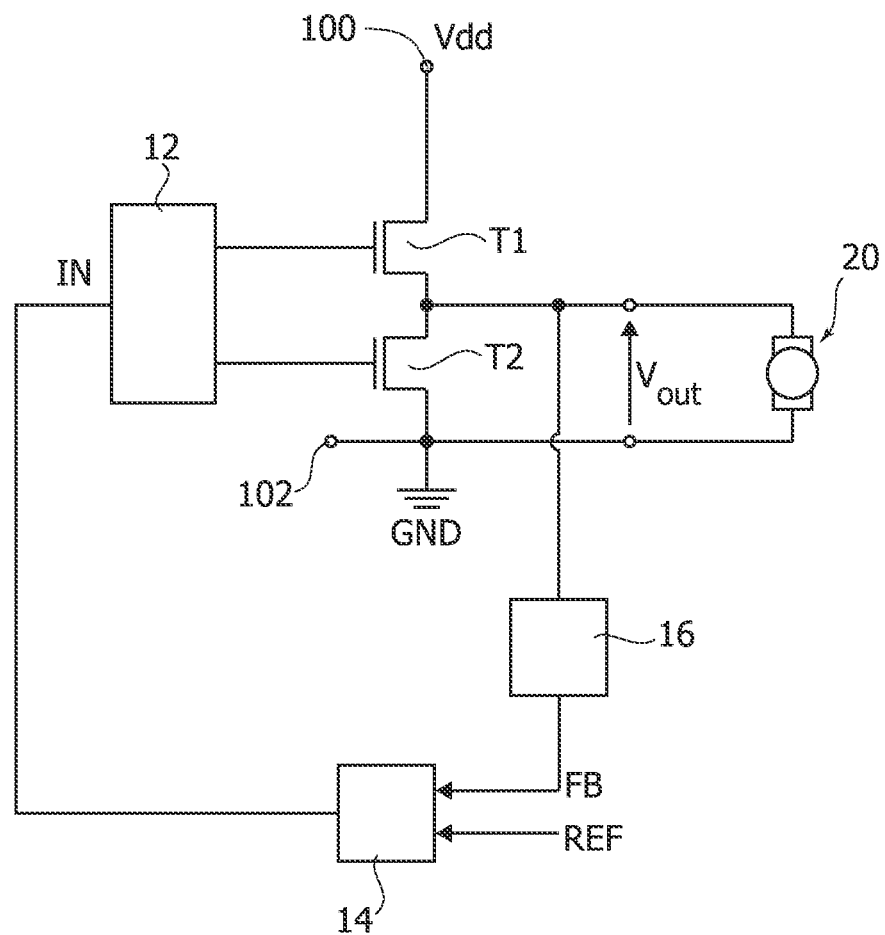
FIG. 3 shows a circuit schematic of a second half-bridge arrangement/circuit comprising also a half-bridge control circuit.

In FIGS. 4 to 12 described below, parts, elements or components that have already been described with reference to FIGS. 1 to 3 are designated by the same references used previously in these figures. The description of these elements has already been made and will not be repeated in what follows in order not to burden the present detailed description.

Figure 4:
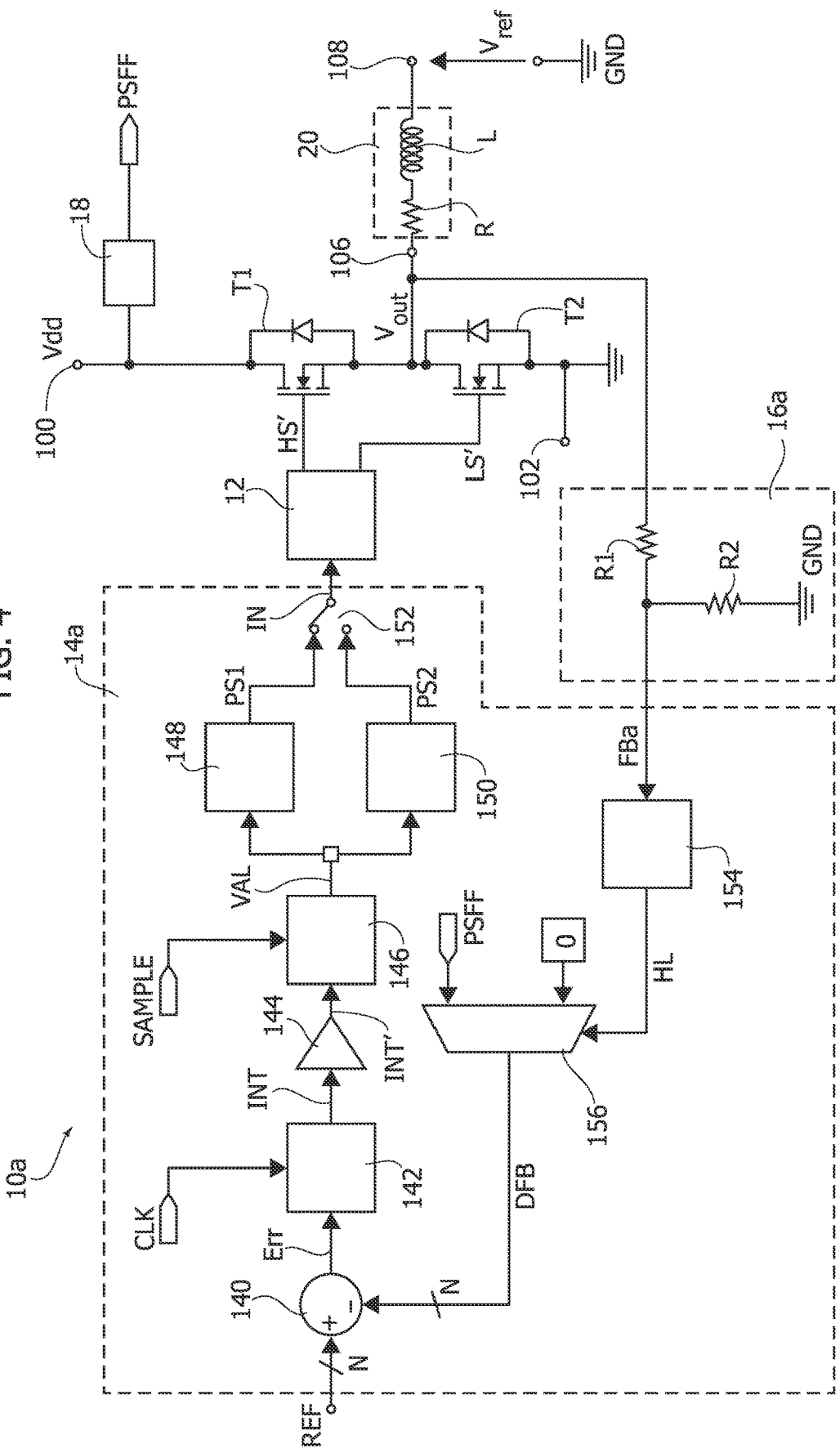
FIG. 4 shows a circuit schematic of a first embodiment of a half-bridge arrangement/circuit comprising a half-bridge control circuit in accordance with the present disclosure.

FIG. 4 shows an embodiment of a half-bridge circuit 10a according to the present disclosure.

As described in the foregoing, a half-bridge arrangement/circuit 10a comprises:
- a (positive) supply terminal 100 configured to be connected to a supply voltage Vdd;
- a (negative) supply terminal 102 configured to be connected to a reference voltage, such as a ground GND;
- an input terminal 104 for receiving a binary input signal IN indicating the switching state of the half-bridge arrangement 10;
- an output terminal 106 configured to be connected to a load 20, thereby providing an output voltage Vout to the load 20;
- a first/high-side electronic switch T1 (having a current-path) connected (e.g. directly) between the terminal 100 and the terminal 106;
- a second/low-side electronic switch T2 (having a current-path) connected (e.g. directly) between the terminal 106 and the terminal 102; and
- a half-bridge driver circuit 12 configured to generate drive signals HS' and LS' for the control terminals of the electronic switches T1 and T2, respectively, e.g. for the gate terminals of respective FETs.

For a general description of these blocks/circuits, reference can be made to the description of FIGS. 1 to 3. For example, in various embodiments, the half-bridge driver circuit 12 may be configured to introduce dead-times $T_{D1}$ and $T_{D2}$, and/or may perform a slew-rate control of the switching node 106.

In various embodiments, the half-bridge arrangement 10a comprises further:
- a feedback circuit 16a configured to generate a feedback signal FBα indicative of (e.g. proportional to) the instantaneous value of the voltage Vout;
- a half-bridge control circuit 14a configured to generate the signal IN for the half-bridge driver circuit 12 as a function of the (analog) feedback signal FBα and a digital reference signal REF indicative of (e.g. proportional to) a requested output voltage Vout; and
- an analog-to-digital converter 18 configured to determine a digital sample PSFF of the value of the supply voltage Vdd.

In various embodiments, the half-bridge control circuit 14a and the analog-to-digital converter 18 are implemented in an integrated circuit. In this case, the integrated circuit may comprise the following terminals, such as pads of the respective die or pins of a respective integrated circuit package:
- a terminal configured to be connected to the feedback circuit 16a (for receiving the feedback signal FBα);
- a terminal configured to be connected to the supply terminals 100 and 102 (for measuring the input voltage Vdd); and
- a terminal configured to be connected to the input terminal of the half-bridge driver circuit 12 (for providing the signal IN to the half-bridge driver circuit 12).

Generally, the digital reference signal REF, may be generated within the integrated circuit, e.g. by a processing circuit, such as a programmable microprocessor, or may be received via a communication interface of the integrated circuit.

In various embodiments, also the half-bridge driver circuit 12 may be integrated in the integrated circuit, i.e. the integrated circuit may comprise a pin/pad for providing the drive signal HS' and LS' to the electronic switches T1 and T2. Similarly, also the switches T1 and T2 may be integrated in the integrated circuit, i.e. the integrated circuit may comprise (in addition to the terminals 100 and 102) a pin/pad 106 for providing the voltage Vout.

For example, in various embodiments, such an integrated circuit may be a micro-controller comprising:
- a programmable microprocessor providing the reference signal REF;
- the half-bridge control circuit 14a;
- the analog-to-digital converter 18; and
- optionally (at least part of) the half-bridge driver circuit 12 and/or the switches T1 and T2.

As described in the foregoing, the output terminal 106 may be connected to a load 20. For example, in the embodiment considered is shown an inductive load 20, schematically shown via a resistance R and an inductance L connect in series. In various embodiments, the load 20 is connected (e.g. directly) between the terminal 106 and a terminal 1o8, which corresponds to a reference voltage Vref, such as:
- ground GND, i.e. the terminal 108 is connected directly to the terminal 102;
- the supply voltage Vdd, i.e. the terminal 108 is connect directly to the terminal 100; or
- a voltage corresponding to half of the supply voltage Vdd, e.g. the terminal 108 may be connected via a first capacitor to the terminal 100 and via a second capacitor to the terminal 102, wherein the two capacitors have the same capacitance.

In various, the voltage Vref may also be switched between Vdd and GND, e.g. via a second half-bridge arrangement.

As mentioned before the feedback circuit 16a is configured to generate a feedback signal FBα indicative of (e.g. proportional to) the instantaneous value of the voltage Vout. For example, in the embodiment considered, the feedback circuit 16a comprises a resistive voltage divider comprising (at least) two resistor R1 and R2 connected (e.g. directly) in series between the terminals 106 and 102, wherein the feedback signal FBα corresponds to the voltage at one of the resistors, typically the resistor connected to the terminal 102/GND, i.e. the resistor R2 in the embodiment considered.

Accordingly, various embodiments of the present disclosure use an analog-to-digital converter 18. However, such an analog-to-digital converter 18 is often already used to determine a digital sample PSFF of the value of the supply voltage Vdd, e.g. in case the supply voltage Vdd is provided by a battery. Similarly, such an ADC 18 may already be used when the supply voltage Vdd is obtained via an electronic converter, wherein the electronic converter comprises a digital control unit configured to regulate the voltage Vdd to a given request value. Thus, compared to the solution shown in FIG. 3, no additional high-resolution ADC may be required to monitor the output voltage Vout.

For example, in various embodiments, the analog-to-digital converter 18 may be an ADC having a resolution of at least 10 bits, preferably between 10 and 16 bits, preferably 12 bits. For example, when using 12 bits, the analog-to-digital converter 18 may provide a digital value PSFF in the range between 0 and 4095. In various embodiments, the maximum value of the ADC 18 is associated with a given voltage value, e.g. 3.3 or 5.0 VDC.

As described in the foregoing, the half-bridge control circuit 14a is configured to generate the signal IN for the half-bridge driver circuit 12 as a function of the analog feedback signal FBα (proportional to the output voltage Vout) and the digital sample PSFF (proportional to the supply voltage Vdd).

Specifically, in various embodiments, the half-bridge control circuit 14a comprises an analog comparator 154 configured to generate a binary signal HL indicating whether the feedback signal FBα is greater than a given threshold value. For example, a microcontroller often comprises such analog comparator, which also permits to set the threshold value for the comparator. For example, in the embodiment considered, the feedback signal FBα corresponds to a scaled down version of the voltage Vout, e.g.:

$$FBa = Vout \cdot R_2/(R_1 + R_2). \quad (1)$$

wherein Vout corresponds to Vdd or o. Accordingly, in various embodiments the threshold value may correspond (approximately) to Vdd/2·R2/(R1+R2).

However, in various embodiments, the comparator 154 may also be implemented with a Schmitt-Trigger, which typically forms part of the input circuit of a pad of an integrated circuit, i.e. the comparator 154 may be implemented with the input logic of a digital pin of the integrated circuit comprising the half-bridge control circuit 14a.

Accordingly, in various embodiments, the signal HL is set to:

a first logic level (e.g. high) when (the signal FBα indicates that) the voltage Vout is greater than a given first threshold value, thereby indicating that Vout corresponds to Vdd (switch T1 closed and switch T2 opened), a second logic level (e.g. low) when (the signal FBα indicates that) the voltage Vout is smaller than a given second threshold value (wherein the second threshold is smaller or equal to the first threshold), thereby indicating that Vout corresponds to GND (switch T1 opened and switch T2 closed).

In various embodiments, the (digital) signal HL is provided to a multiplexer 156 configured to provide a (digital) signal DFB by selecting either the value PSFF or the value "o" as a function of the signal HL. Specifically, the multiplexer 156 is configured to provide at output:

the value PSFF when the signal HL is set to the first logic level (e.g. high); and zero ("0") when the signal HL is set to the second logic level (e.g. low).

The comparator circuit 154 is thus purely optional, because by dimensioning in a suitable manner the feedback circuit 16a, e.g. the voltage divider R1/R2, the feedback signal FBα may be used to drive directly the input of the multiplexer 156, i.e. the signal HL corresponds to the signal FBα. Thus, in general, the multiplexer 156 and the optional comparator 154 implement a selector circuit configured to select the value PSFF or "0" as a function of the feedback signal FBα.

In the embodiment considered, the (digital) reference signal REF and the signal DFB are provided to a digital subtractor circuit 140 configured to calculate an error signal Err by subtraction the value DFB from the reference value REF, i.e. Err=REF−DFB.

Generally, any digital encoding scheme may be used for the signals REF and DFB (and thus also the other signals, such as Err and PSFF).

Specifically, in various embodiments, a binary encoding is used. More specifically, considering a reference signal REF having N bit, the error signal Err may have N+1 bit in order to signal also negative numbers. Specifically, in various embodiments, a two's complement binary encoding is used for the signal Err. Moreover, in various embodiments, also the signal DFB has N bits. Accordingly, in case the signals PSFF and REF have not the same number of bits an upscaling or downscaling may be performed by the multiplexer 156.

For example, in case N=12 and assuming a reference signal REF having the decimal value 1800 ("0111 0000 1000") and a signal PSFF having the decimal value 3000 ("1011 1011 1000"), the signal Err corresponds to:

1200 ("11011 0101 0000"), when the signal FBα indicates that the output voltage Vout is high, i.e. when the switch T1 is closed and the switch T2 is opened; and 1800 ("0111 0000 1000"), when the signal FBα indicates that the output voltage Vout is low, i.e. when the switch T1 is opened and the switch T2 is closed.

In various embodiments, even though these number are positive numbers, a two's complement binary (signed) encoding may also be used for the values REF and DFB, i.e. the most significant bit would be "0".

In various embodiments, the signal Err is provided to an input of a digital integrator circuit 142 configured to calculate a value INT indicative of the integral of the value Err.

Figure 5:
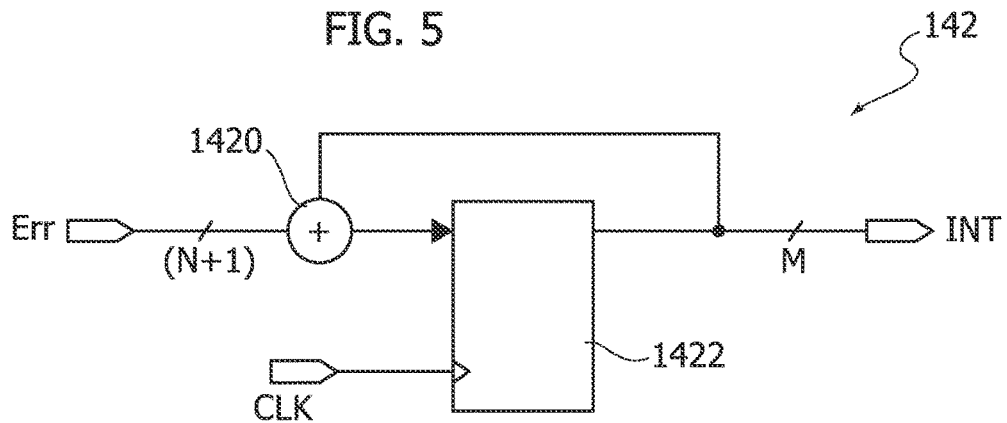
FIGS. 5, 6A, 6B, 7, 8, 9 and 10 shows embodiments of various sub-circuits of the half-bridge control circuit of FIG. 4.

For example, FIG. 5 shows an embodiment of the digital integrator circuit 142.

In the embodiment considered, the digital integrator circuit 142 is implemented with an accumulator, e.g. comprising:
- a register 1442 providing the signal INT, wherein the register 1442 is configured to store an input signal in response to a clock signal CLK; and
- a digital adder circuit 1420 configured to calculate the input signal for the register 1442 by summing the signal Err to the signal INT at the output of the register 1442.

Thus, in various embodiments, the signal INT is updated with the frequency of the clock signal CLK. For example, in various embodiments, the frequency of the clock signal CLK may be between 10 e 100 MHz, e.g. 20 MHz.

As mentioned before, the signal Err has N+1 bits. Conversely, the signal INT has M bits, with M>(N+1), i.e. M=(N+K). For example, in various embodiments, M>N+8. For example, in various embodiments, the signal INT has between 18 and 32 bits, e.g. 20 bits.

In various embodiments, the integral signal INT is provided to a downscale circuit 144 configured to downscale the signal INT having M bits to a signal INT having only L bits, with L<M and preferably L=N.

Figure 6A:
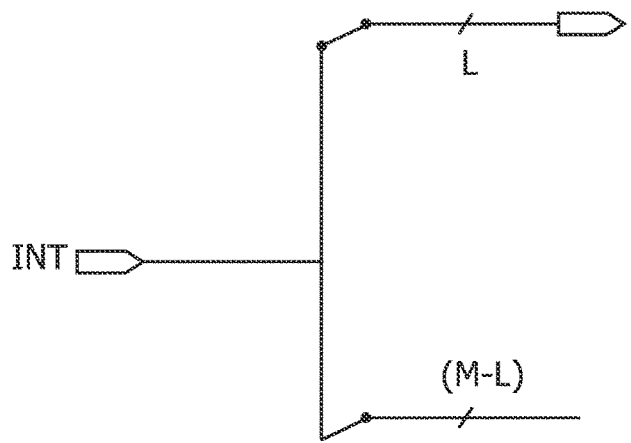

For example, in various embodiments, the circuit 144 may select only the L most significant bits of the signal INT. In this case, the signal INT uses thus the two's complement binary encoding. As shown in FIG. 6A, in this case the downscale circuit 144 may use a simple shift-right operation which selects the L most significant bits of the signal INT and the (M−L) least significant bits are discarded. In fact, while the value Err may assume either positive and negative values, in real operating conditions, the signal INT assumes only positive or zero values and so it can be considered a positive unsigned number. Accordingly, the signal INT may use the L most significant bits. In fact, as described with respect to the signal REF and DFB, also the signal INT may use a signed encoding, even though the value INT is considered a positive (unsigned) number.

In various embodiment, the downscale circuit 144 may also return to an unsigned binary encoding and/or limit the range of the signal INT, e.g. by converting negative numbers INT into zero.

Figure 6B:
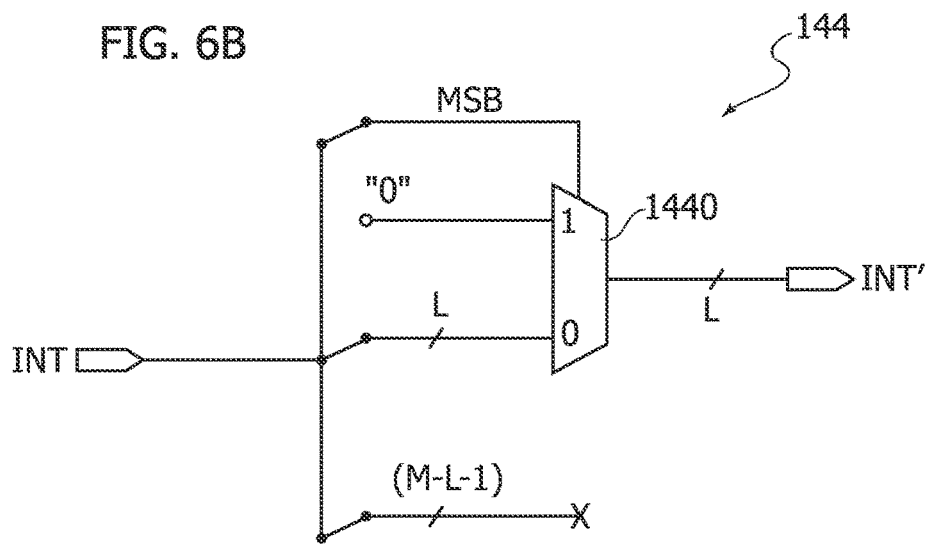

For example, FIG. 6B shows a possible embodiment of the downscale circuit 144.

Specifically, in the embodiment considered, the M bits of the signal INT are split into:
- the most significant bit MSB,
- the following L bits, and
- the remaining (M−L−1) lower bits.

In the various embodiments, the bit MSB indicates thus whether the number INT is negative (MSB=1) or positive (MSB=0). Accordingly, in the embodiment considered, the bit MSB is used to select via a multiplexer 1440 for the signal INT either:
- the value "0" when the bit MSB is high; or
- the group of L bits of the signal INT when the bit MSB is low.

Conversely, the (M−L−1) lower bits are discarded.

As mentioned before, due to the fact that in real operation the signal INT may not assume negative values, the bit MSB is always "0" and thus the multiplexer 1440 may be removed, i.e. the circuit 144 may skip the bit MSB and assign to the signal INT the following L bits.

Figure 7:
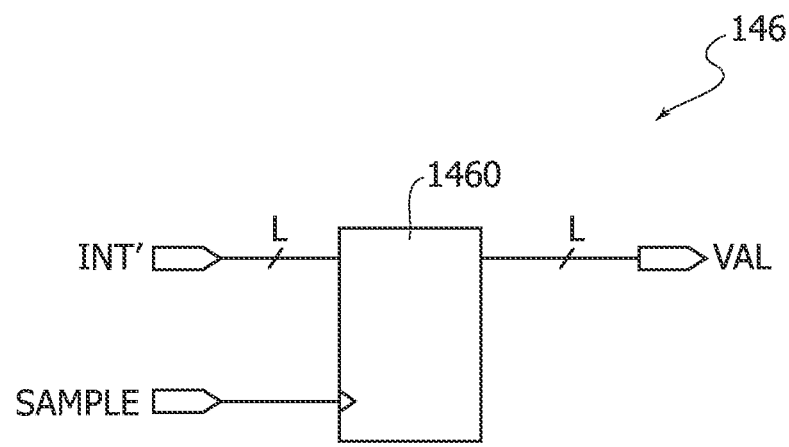

In various embodiments, the signal INT is then sampled at a sampling circuit 146 in response to a sampling signal SAMPLE. For example, the signal SAMPLE may be used to sample the signal INT when a new switching cycle starts. For example, as shown in FIG. 7, such a sampling circuit 146 may be implemented with a register 1460 receiving at a data input the signal INT and at a clock terminal the sample signal SAMPLE. Accordingly, in general, the sampling circuit provides a signal VAL by sampling the signal INT in response to the sampling signal SAMPLE. In general, the sampling signal SAMPLE may be generated by downscaling the frequency of the clock signal CLK, a separate clock generator or (as will be described in the following) a pulse generator circuit configured to generate the pulsed signal IN.

Specifically, in various embodiments, the signal VAL is then provided to one or more pulse generator circuits configured to generate a pulsed signal as a function of the value VAL. Specifically, each of these pulse generator circuits is configured to generate a pulsed signal PS having given switch-on and switch-off durations $T_{ON}$ and $T_{OFF}$, wherein at least one of these durations is determined as a function of the signal VAL. Specifically, in various embodiments, each of these pulse generator circuits is configured to generate a pulsed signal PS, wherein the ratio $T_{ON}/(T_{ON}+T_{OFF})$ during a sequence of switching cycles is determined as a function of the signal VAL.

For example, in various embodiments, a first circuit 148 is a PWM signal generator circuit configured to generate a pulsed signal PS1 having a constant switching cycle duration $T_{SW}$, and wherein the duty cycle $T_{ON}/(T_{ON}+T_{OFF})$ of the signal PS1 is a function of the value VAL.

Figure 8:
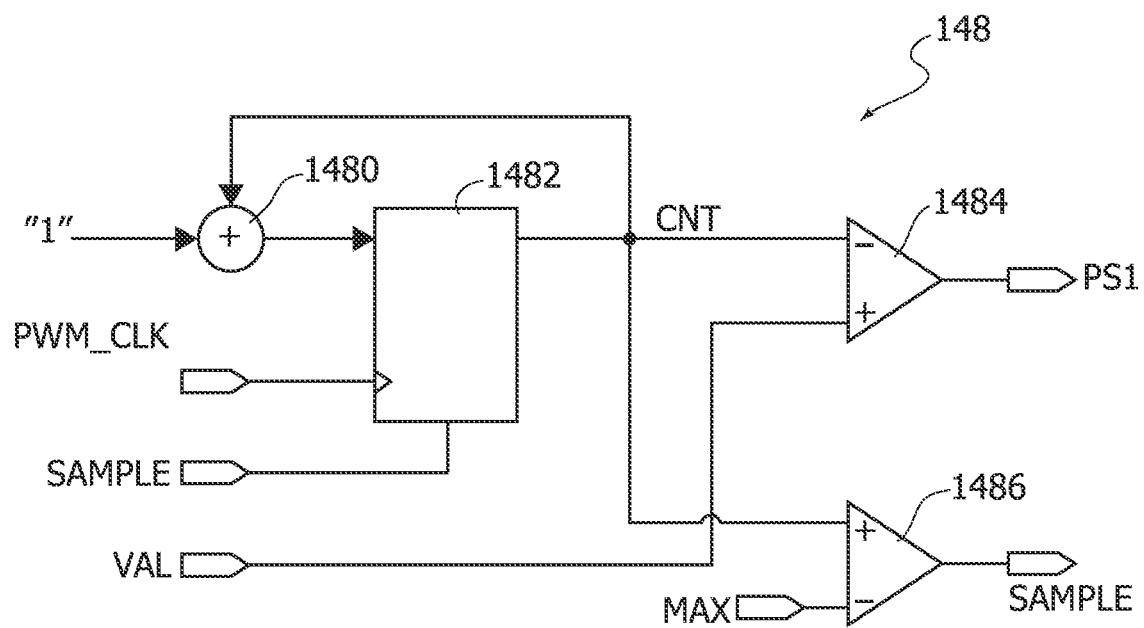

For example, FIG. 8 shows a possible embodiment of the PWM signal generator circuit 148.

Specifically, in the embodiment considered, the PWM signal generator circuit 148 comprises a counter 1480/1482 configured to increase a count value CNT by a given constant increment value at each clock cycle of a clock signal PWM_CLK. The clock signal PWM_CLK may correspond to the clock signal CLK or a scaled down version thereof. For example, in the embodiment considered, the counter is increased by "1" at each clock cycled.

For example, as schematically shown in FIG. 8, such a counter may be implemented with:
- an adder 1480 providing at output the sum of the current count value CNT and the increment value (e.g. "1"), and
- a register 1482 configured to provide the count value CNT by storing the value provided by the adder 1480 in response to the clock signal PWM_CLK.

In the embodiment considered, the count value CNT is then provided to two comparators 1484 and 1486, wherein:
- the comparator 1484 is configured to generate the pulsed signal PS1 by comparing the count value CNT with the value VAL, and
- the comparator 1486 is configured to generate the sampling signal SAMPLE (indicative of the end of the switching cycle/start of the new switch-cycle) by comparing the count value CNT with a maximum value MAX.

In the embodiment considered, the sampling signal SAMPLE is also used to reset the counter/register 1482, thereby starting a new switching cycle $T_{SW}$. Thus, in the embodiment considered, the value MAX indicates the duration $T_{SW}$ of a switching cycle and the value VAL is indicative of the switch-on duration $T_{ON}$ of the PWM signal.

Figure 9:
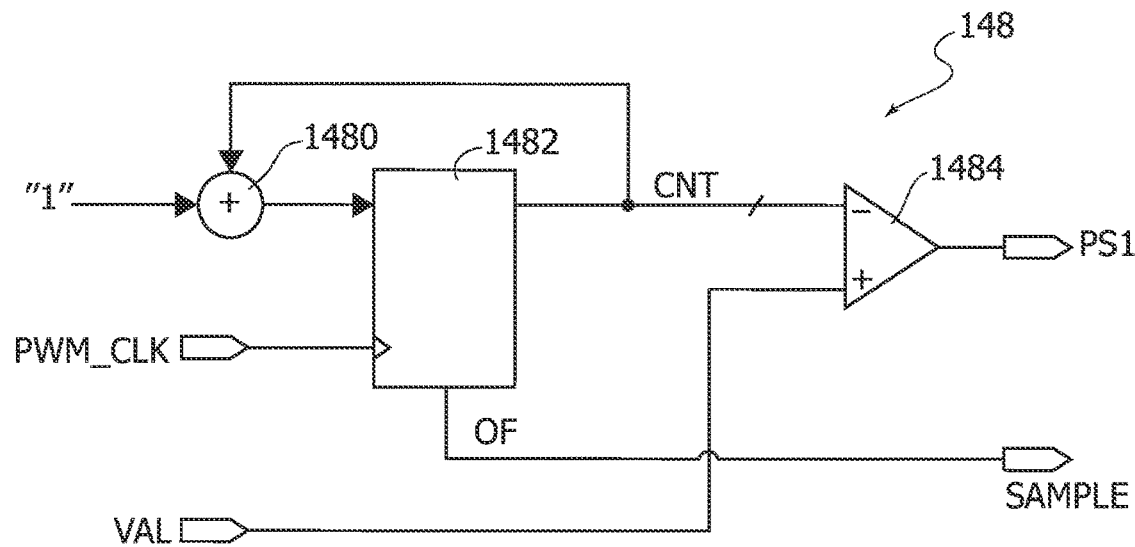

As shown in FIG. 9, in various embodiments a counter with overflow may be used. In this case, the most significant/overflow bit OF of the counter may be used both as sampling signal SAMPLE and to reset the counter/register 1482.

In various embodiments, a second circuit 150 is a sigma-delta PWM signal generator circuit, configured to generate a pulsed signal PS2.

Figure 10:
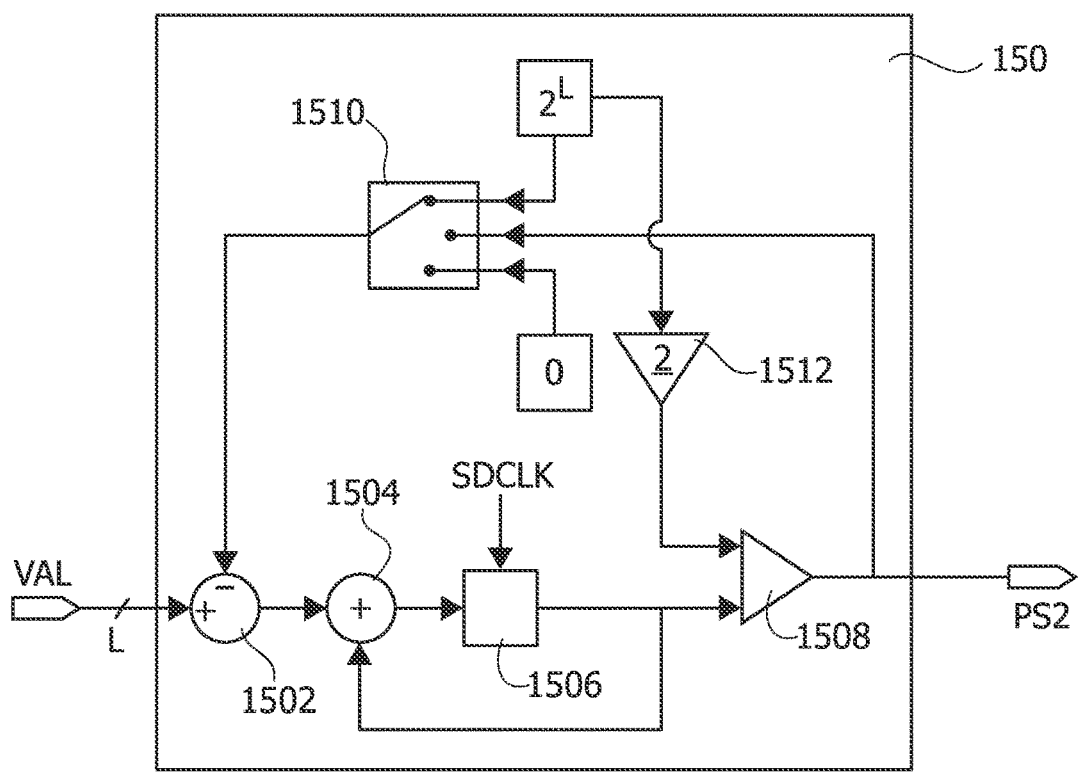

FIG. 10 shows an embodiment of such a sigma-delta PWM signal generator circuit 150.

Specifically, in the embodiment considered, the value VAL is provided to a digital subtractor circuit 1502. The subtractor circuit 1502 is configured to subtract a value provided by a selector circuit 1510 from the value VAL. Specifically, the selector circuit 1510, such as a multiplexer, is configured to provide either the value $2^L$ or "0" as a function of the logic value of the output signal PS2. Specifically, the value provided to the subtractor 1502 is set to "0" when the signal PS2 is low, i.e. the subtractor circuit 1502 provides the value VAL, and to $2^L$ when the signal PS2 is high, i.e. the subtractor circuit 1502 provides the value VAL$-2^L$.

In the embodiment considered, the value at the output of the subtractor circuit 1502 is provided to an accumulator, e.g. implemented with:
  a register 1506 configured to store a value at the input of the register 1506 in response to a clock signal SDCLK, which may correspond to the previously described clock signal PWM_CLK or any other clock signal;
  a digital adder circuit 1504 configured to provide the sum of the value provided by the subtractor circuit 1502 and the value at the output of the register 1506.

In the embodiment considered, the value at the output of the register 1506 is also provided to a digital comparator circuit 1508 configured to compare the value at the output of the register 1506 with a threshold value corresponding to $2^L/2$. For example, this is schematically shown via a "/2" downscale circuit 1512 receiving at input the value $2^L$.

In various embodiments, the control circuit 14a may thus comprise a switch or multiplexer 152 configured to provide as signal IN one of the pulsed signals PS1 or PS2. For example, the selection may be programmable, e.g. by connecting a pin/pad of the integrated circuit to a given logic level (high or low), or via a processing unit of the integrated circuit.

Accordingly, in the embodiment shown in FIG. 4, the signals REF and DFB have the same number N of bits. The feedback circuit 16a provides, e.g. via a resistive voltage divider R1/R2, a signal FBα proportional to the output voltage Vout at the terminal 106. When the feedback signal FBα is lower than a given threshold, e.g. fixed to half of the maximum value of Vout as scaled by the feedback circuit 16a, the signal DFB is set to zero and otherwise to the value PSFF provided by the ADC 18. Specifically, in the embodiment considered, the value PSFF is not a fixed value but depends on the amplitude of the supply voltage Vdd, thereby permitting to compensate both variations of the supply voltage Vdd and distortions of the output voltage Vout. Specifically, the proposed feedback loop is based on instantaneous values of the voltage Vout, thereby avoiding the need of a low-pass filter in order to monitor the average value of the output voltage Vout and an additional ADC used to obtain samples of the average output voltage Vout.

Figure 11:
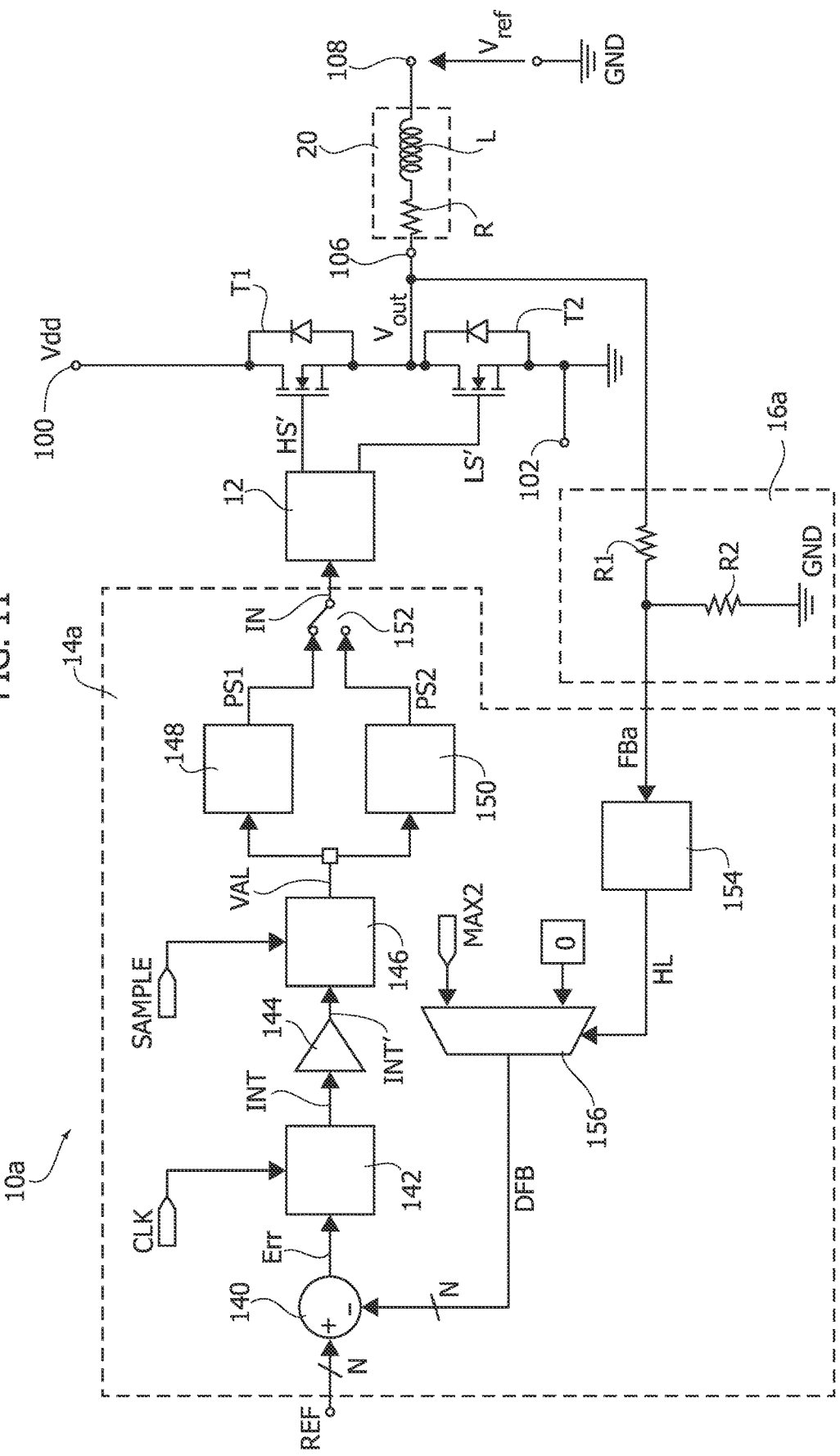
FIG. 11 shows a circuit schematic of a second embodiment of a half-bridge arrangement/circuit.

In various embodiments, as shown in FIG. 11, when the supply voltage Vdd is stable, the half-bridge control circuit 14a may also be used without the ADC 18.

In this case, the value PSFF at the input of the multiplexer 156 may be replaced with a fixed value MAX2.

For example, in a first embodiment, the value MAX2 may be indicative of the value of the supply voltage Vdd, e.g. the decimal value 3000 may be indicative of a voltage Vdd of 3.0 V. Accordingly, in this case the value of the reference voltage REF indicates a requested output voltage Vout, e.g. the value 1800 may indicate an average output voltage of 1.8 V.

Conversely, in other embodiment, the value MAX2 corresponds to the maximum value of the signal REF, e.g. 4095, or preferably the maximum value plus one, e.g. 4096. Accordingly, in this case the value of the reference voltage REF indicates a percentage of the output voltage Vout, e.g. the value 1800 may indicate an average output voltage Vout corresponding to 1800/4096=43.95% of the input voltage Vdd.

For example, when assuming N=12 bits, REF=1800, and MAX2=4096, the error signal Err will be set to 1800 (when the signal HL is low) or to (1800-4096)=−2296 (when the signal HL is high). Thus, in various embodiment, the signal DFB may have N+1 bits, wherein the lower N bits are set to "0" and the most significant bit (N+1) is set to:
  "1", when the signal HL is set to high; and
  "0", when the signal HL is set to low.

In this case, the multiplexer 156 may thus only provide the most significant bit (N+1) of the signal DFB.

Figure 12:
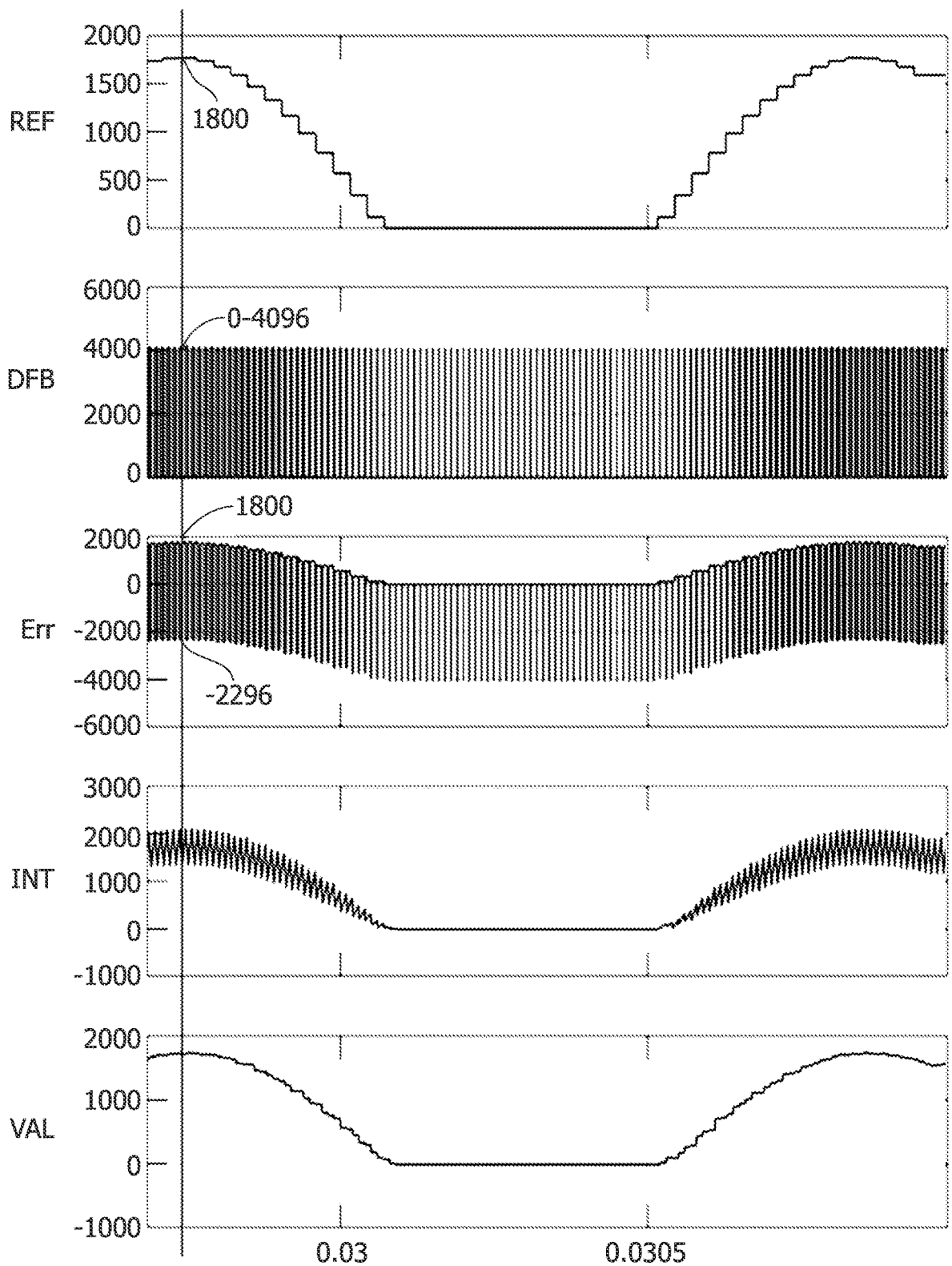
FIG. 12 shows exemplary waveforms of the control signals used by the half-bridge control circuit of FIG. 11.

For example, FIG. 12 shows possible waveforms for a sinusoidal modulation of the reference signal REF (between 0 and 1800, and the respective signals DFB, Err, INT and VAL.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A method of controlling a half-bridge circuit, the method comprising:
  receiving an analog feedback signal proportional to an output of the half-bridge circuit;
  selecting a digital feedback signal in accordance with the analog feedback signal;
  subtracting the digital feedback signal from a digital reference signal to generate a digital error signal;
  integrating the digital error signal to generate an integration error signal;
  downscaling the integration error signal to generate a downscaled integration signal;
  sampling the downscaled integration signal to generate a sampled integration signal; and
  generating pulsed signals from the sampled integration signal to provide an input to the half-bridge circuit.

2. The method of claim 1, further comprising generating, with a resistive voltage divider, the analog feedback signal proportional to the output of the half-bridge circuit.

3. The method of claim 1, further comprising:
  comparing the received analog feedback signal with a threshold value; and
  selecting the digital feedback signal based on a result of the comparing.

4. The method of claim 1, wherein a positive supply for the half-bridge circuit is not stable, and the selecting the digital feedback signal comprises:
  selecting zero in response to the analog feedback signal indicating that the output of the half-bridge circuit corresponds to a positive supply voltage for the half-bridge circuit; or
  selecting a digital sample of the positive supply voltage in response to the analog feedback signal indicating that the output of the half-bridge circuit corresponds to ground.

5. The method of claim 1, wherein a positive supply for the half-bridge circuit is stable, and the selecting the digital feedback signal comprises:
selecting zero in response to the analog feedback signal indicating that the output of the half-bridge circuit corresponds to a positive supply voltage for the half-bridge circuit; or
selecting a fixed value in response to the analog feedback signal indicating that the output of the half-bridge circuit corresponds to ground, the fixed value corresponding to the positive supply voltage or to a maximum value of the digital reference signal.

6. The method of claim 1, wherein the integrating comprises:
storing, by a register, an input signal in response to a clock signal;
adding, by a digital adder circuit, the digital error signal to the integration error signal at an output of the register to generate the input signal for the register; and
providing, by the register, the integration error signal.

7. The method of claim 1, wherein the digital reference signal has N bits, the digital feedback signal has N bits, the digital error signal has N+1 bits, the integration error signal has M bits where M>N+1, the downscaled integration signal has N bits, and the downscaling further comprises:
selecting N most significant bits of the integration error signal to generate the downscaled integration signal; or
selecting N next-most significant bits after a most significant bit of the integration error signal to generate the downscaled integration signal.

8. The method of claim 1, wherein the sampling comprises:
receiving, by a register, the downscaled integration error signal; and
clocking the register, at a start of a switching cycle, to generate the sampled integration signal.

9. The method of claim 1, wherein the generating the pulsed signals comprises:
generating, by a first pulse width modulator, a first pulsed signal having a constant switching cycle duration and a duty cycle that is a function of the sampled integration signal.

10. The method of claim 9, wherein the generating the pulsed signals further comprises:
generating, by a second sigma-delta pulse width modulator, a second pulsed signal having a constant switching cycle duration and a duty cycle that is a function of the sampled integration signal; and
selecting the first pulsed signal or the second pulsed signal to provide the input to the half-bridge circuit.

11. A method of controlling a half-bridge circuit, the method comprising:
receiving an analog feedback signal proportional to an output of the half-bridge circuit;
generating, by a comparator, a binary signal indicating whether the analog feedback signal is greater than a threshold value;
selecting a digital feedback signal in accordance with the binary signal;
subtracting the digital feedback signal from a digital reference signal to generate a digital error signal;
integrating the digital error signal to generate an integration error signal;
downscaling the integration error signal to generate a downscaled integration signal;
sampling the downscaled integration signal to generate a sampled integration signal; and
generating pulsed signals from the sampled integration signal to provide an input to the half-bridge circuit.

12. The method of claim 11, further comprising generating, with a resistive voltage divider, the analog feedback signal proportional to the output of the half-bridge circuit.

13. The method of claim 11, wherein the generating the binary signal is performed using a Schmitt-Trigger of an input circuit of a pad of an integrated circuit comprising the half-bridge circuit.

14. The method of claim 11, wherein a positive supply for the half-bridge circuit is not stable, and the selecting the digital feedback signal comprises:
selecting zero in response to the analog feedback signal indicating that the output of the half-bridge circuit corresponds to a positive supply voltage for the half-bridge circuit; or
selecting a digital sample of the positive supply voltage in response to the analog feedback signal indicating that the output of the half-bridge circuit corresponds to ground.

15. The method of claim 11, wherein a positive supply for the half-bridge circuit is stable, and the selecting the digital feedback signal comprises:
selecting zero in response to the analog feedback signal indicating that the output of the half-bridge circuit corresponds to a positive supply voltage for the half-bridge circuit; or
selecting a fixed value in response to the analog feedback signal indicating that the output of the half-bridge circuit corresponds to ground, the fixed value corresponding to the positive supply voltage or to a maximum value of the digital reference signal.

16. The method of claim 11, wherein the integrating comprises:
storing, by a register, an input signal in response to a clock signal;
adding, by a digital adder circuit, the digital error signal to the integration error signal at an output of the register to generate the input signal for the register; and
providing, by the register, the integration error signal.

17. The method of claim 11, wherein the digital reference signal has N bits, the digital feedback signal has N bits, the digital error signal has N+1 bits, the integration error signal has M bits where M>N+1, the downscaled integration signal has N bits, and the downscaling further comprises:
selecting N most significant bits of the integration error signal to generate the downscaled integration signal; or
selecting N next-most significant bits after a most significant bit of the integration error signal to generate the downscaled integration signal.

18. The method of claim 11, wherein the sampling comprises:
receiving, by a register, the downscaled integration error signal; and
clocking the register, at a start of a switching cycle, to generate the sampled integration signal.

19. The method of claim 11, wherein the generating the pulsed signals comprises:
generating, by a first pulse width modulator, a first pulsed signal having a constant switching cycle duration and a duty cycle that is a function of the sampled integration signal.

20. The method of claim 19, wherein the generating the pulsed signals further comprises:
generating, by a second sigma-delta pulse width modulator, a second pulsed signal having a constant switching cycle duration and a duty cycle that is a function of the sampled integration signal; and selecting the first pulsed signal or the second pulsed signal to provide the input to the half-bridge circuit.

* * * * *